United States Patent
Botez et al.

(10) Patent No.: US 6,229,153 B1
(45) Date of Patent: May 8, 2001

(54) HIGH PEAK CURRENT DENSITY RESONANT TUNNELING DIODE

(75) Inventors: Dan Botez, Madison; Luke J. Mawst, Sun Prairie; Ali R. Mirabedini, Madison, all of WI (US)

(73) Assignee: Wisconsin Alumni Research Corporation, Madison, WI (US)

( * ) Notice: Subject to any disclaimer, the term of this patent is extended or adjusted under 35 U.S.C. 154(b) by 0 days.

(21) Appl. No.: 08/879,161

(22) Filed: Jun. 19, 1997

Related U.S. Application Data

(60) Provisional application No. 60/020,141, filed on Jun. 21, 1996.

(51) Int. Cl.$^7$ .......................... H01L 29/72; H01L 29/205
(52) U.S. Cl. ............................... 257/25; 257/627
(58) Field of Search ................. 257/25, 627, 18

(56) References Cited

U.S. PATENT DOCUMENTS

| | | | |
|---|---|---|---|
| 4,929,984 | * 5/1990 | Muto et al. | 257/25 X |
| 4,959,696 | 9/1990 | Frensley et al. | |
| 5,031,005 | * 7/1991 | Futatsugi et al. | 257/25 X |
| 5,569,954 | * 10/1996 | Hata et al. | 257/627 |

FOREIGN PATENT DOCUMENTS

WO 89/02654 * 3/1989 (WO) .................... 257/25

OTHER PUBLICATIONS

L.J. Mawst, et al., "High Continuous Wave Output Power InGaAs/InGaAs/InGaP Diode Laser: Effect of Substrate Misorientation," Appl. Phys. Lett. vol. 67, No. 20. Nov. 13, 1995, pp. 2901–2903.

Francis G. Celii, et al., Optical Diagnostic Monitoring of Resonant–Tunneling Diode Growth, IEEE J. Selected Topics in Quantum Electronics, vol. 1, No. 4, pp. 1064–1072, Dec. 1995.

A. Bhattacharya, et al., Interface structures of InGaAs/InGaAsP/InGaP quantum well laser diodes grown by metalorganic chemical vapor deposition of GaAs substrates, Appl. Phys. Lett. 68 (16), pp. 2240–2242, Apr. 15, 1996.

M.A. Reed, et al., "Resonant Tunneling In a GaAs/AlGaAs Barrier/InGaAs Quantum Well Heterostructure," Appl. Phys. Lett., vol. 50, No. 13, Mar. 30, 1987, pp. 845–847.

J.W. Lee, et al., "Molecular–Beam Epitaxial Growth of AlGaAs/(In, Ga)As Resonant Tunneling Structures," J. Vac. Sci. Technol. B, vol. 5, No. 3, May/Jun. 1987, pp. 771–774.

R.M. Kapre, et al., "High Strained $(InAs)_M/(GaAs)_N$ Multiple Quantum Well Based Resonant Tunneling Diodes On GaAs (100) Substrates and Their Applications in Optical Switching," Met. Res. Soc. Symp. Proc., vol. 228, 1992, pp. 219–224.

E. Lheurette, et al., "$In_{0.1}Ga_{0.9}As$/GaAs/AlAs Pseudomorphic Resonant Tunneling Diodes Integrated with Air–Bridge," Electron. Lett., vol. 28, pp. 937–938, 1992.

\* cited by examiner

*Primary Examiner*—John Guay
(74) *Attorney, Agent, or Firm*—Foley & Lardner

(57) ABSTRACT

A resonant tunneling diode is produced in a gallium arsenide material system formed with barrier layers of AlGaAs with a quantum well layer of low band-gap material between them. The material of the well is selected to adjust the second energy level to the edge of the conduction band in GaAs, with a preferred quantum well layer formed of InGaAs. The resonant tunneling diode structure is grown by a metal organic chemical vapor deposition process on the surface of the nominally exact (100) GaAs substrate. Layers of doped GaAs may be formed on either side of the multilayer resonant tunneling diode structure, and spacer layers of GaAs may also be provided on either side of the barrier layers to reduce the intrinsic capacitance of the structure.

22 Claims, 4 Drawing Sheets

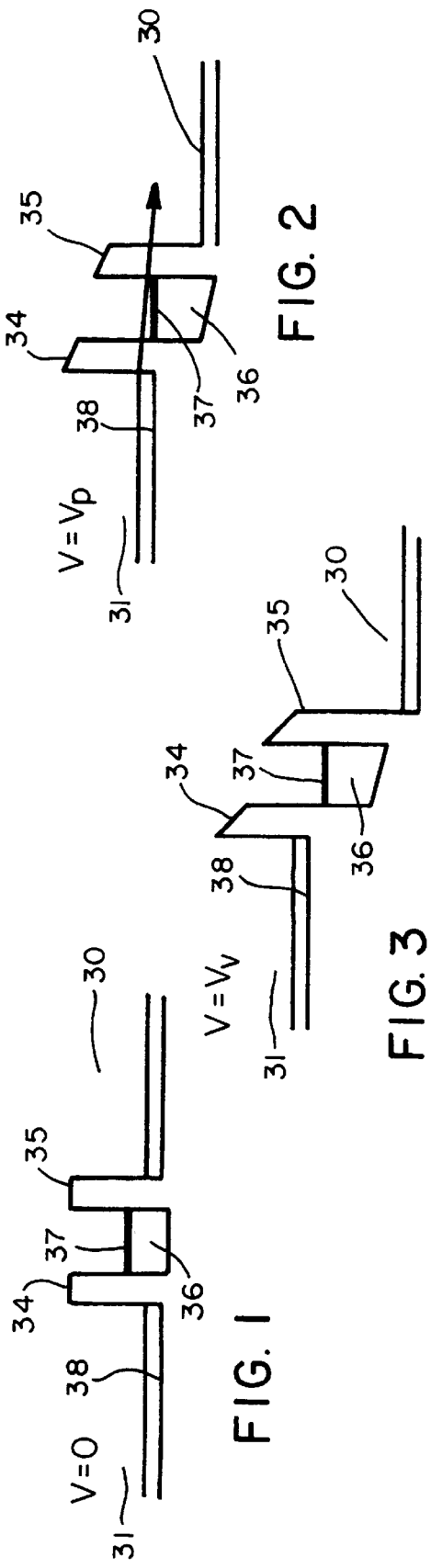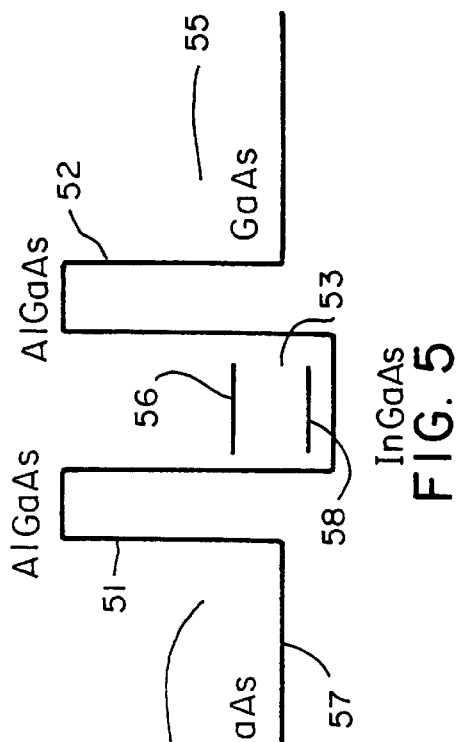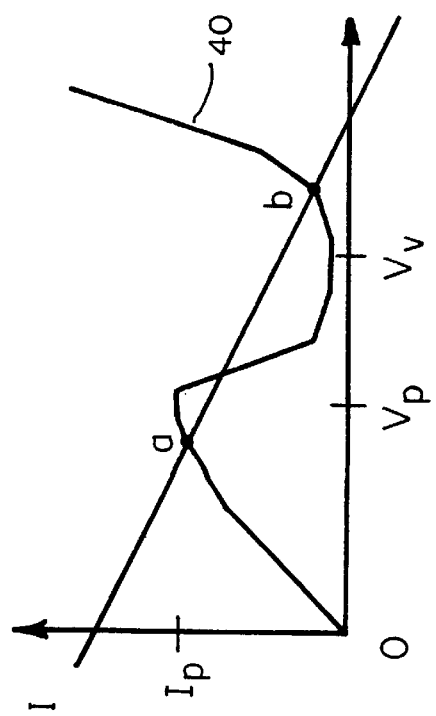

HIGH PEAK CURRENT DENSITY RESONANT TUNNELING DIODE

This application claims the benefit of U.S. provisional application Ser. No. 60/020,141, filed Jun. 21, 1996.

This invention was made with United States government support awarded by the following agency: AFOSR Grant No. F49620-95-C-0058. The United States government has certain rights in this invention.

FIELD OF THE INVENTION

This invention pertains generally to the field of semiconductor devices and more particularly to resonant tunneling diodes.

BACKGROUND OF THE INVENTION

Resonant tunneling diodes comprise semiconductor structures having two large band-gap barrier layers with a single low band-gap quantum well between them. Collector 30 and emitter 31 contact regions are provided in the semiconductor structure to provide collection and supply of electrons as illustrated in the simplified band diagram of FIG. 1. The thicknesses of barrier layers 34 and 35 and the thickness of the quantum well 36 between them, and the composition of these structures, are chosen so that quantum effects create a single resonant energy level 37 slightly above the emitter conduction band edge 38. As the emitter 31 is negatively biased, the two bands will come into alignment at a peak voltage $V_p$, as illustrated in FIG. 2, and electrons will tunnel through to the collector region 30 where they are collected. As the negative bias is increased still further, the emitter conduction band 38 rises above the resonant energy level 37, as illustrated in FIG. 3, drastically reducing the tunneling current. The result is a negative resistance region that creates the utility of the resonant tunneling diode (RTD). As the emitter bias is increased still further, current will rise again as electrons are emitted over the barrier. FIG. 4 shows a typical current-voltage relationship curve 40 for a typical RTD.

The high speed voltage transition occurs when the RTD is switched from the stable point "a" in FIG. 4 to the stable point "b". The voltage swing is maximized by making the voltage $V_p$ low and the voltage $V_v$ high. Switching speed is maximized by making the peak current $I_p$ as large as possible for a given conduction area. The valley current at the voltage $V_v$ is of great significance for high-speed applications, and should be as low as possible to maximize the current available to charge the load capacitance thus reducing the switching time.

It is desirable that RTDs be highly reliable and stable over time and with temperature changes, and have typical performance characteristics that include voltage swings of one to two volts, peak current densities of 100 to 200 kA/cm$^2$, peak currents of 10 to 20 mA, peak voltages of 1 volt, peak to valley current ratios of at least 3, and a rise time of less than 2 picoseconds. Such characteristics have been achieved previously in devices made of pseudomorphic AlAs/InAs/AlAs quantum wells fed by lattice-matched InGaAs contact layers, and grown on InP by molecular beam epitaxy. However, the InP material system is not well suited for practical applications, and the technology is immature. GaAs would be ideal, but GaAs/AlAs RTDs cannot reach the performances of InP-based devices.

SUMMARY OF THE INVENTION

The resonant tunneling diode (RTD) of the present invention combines all of the desirable characteristics for such a diode in a single device which can be produced in a gallium arsenide material system using the processing techniques compatible with large scale production, particularly metal organic chemical vapor deposition (MOCVD). The device is capable of peak current densities in excess of 300 kA/cm$^2$ at relatively low peak voltages in the range of 1 volt. Switching times in the range of 1 picosecond can be obtained.

The multilayer RTD structure preferably is formed of barrier layers of AlGaAs with a quantum well layer formed of low band-gap material between them. The material of the well is selected to adjust the second energy level to, i.e., at or slightly above, the edge of the conduction band in GaAs. A preferred material for the quantum well layer is InGaAs. The RTD structure is grown by an MOCVD process on the surface of a nominally exact (100) GaAs substrate. To complete the device, layers of doped GaAs may similarly be formed on either side of the multilayer RTD structure. Spacer layers of GaAs may also be provided as part of the RTD structure on either side of the barrier layers to reduce the intrinsic capacitance of the structure.

It has been found that in the present invention a structure grown by the MOCVD process on the exact (100) GaAs substrate will produce smooth interfaces between the various layers, including the strained layer quantum well structure, to allow the achievement of high current density and other desirable characteristics at conventional operating temperatures (e.g., 300 K). The resulting structure provides resonant tunneling through the second energy level in a strained-layer quantum-well. The growth of strained-layer InGaAs quantum well structures using exact on-orientation substrates produces distinct layers with relatively abrupt transitions at interfaces, significantly improving the smoothness of the interfaces and consequent device performance over devices which are grown off-orientation. Specifically, rough interfaces cause carrier scattering which significantly increases the valley current and thus makes the device impractical. By smoothing the interfaces, high peak-to-valley ratios can thus be obtained.

Further objects, features and advantages of the invention will be apparent from the following detailed description when taken in conjunction with the accompanying drawings.

BRIEF DESCRIPTION OF THE DRAWINGS

In the drawings:

FIG. 1 is a simplified band diagram of a typical resonant tunneling diode (RTD) structure.

FIG. 2 is a band diagram as in FIG. 1 illustrating negative bias of the emitter.

FIG. 3 is a band diagram as in FIG. 2 with further negative bias of the emitter.

FIG. 4 is a typical current-voltage relationship curve for a typical RTD.

FIG. 5 is a simplified band diagram for the RTD of the present invention.

DETAILED DESCRIPTION OF THE INVENTION

Figure 6:
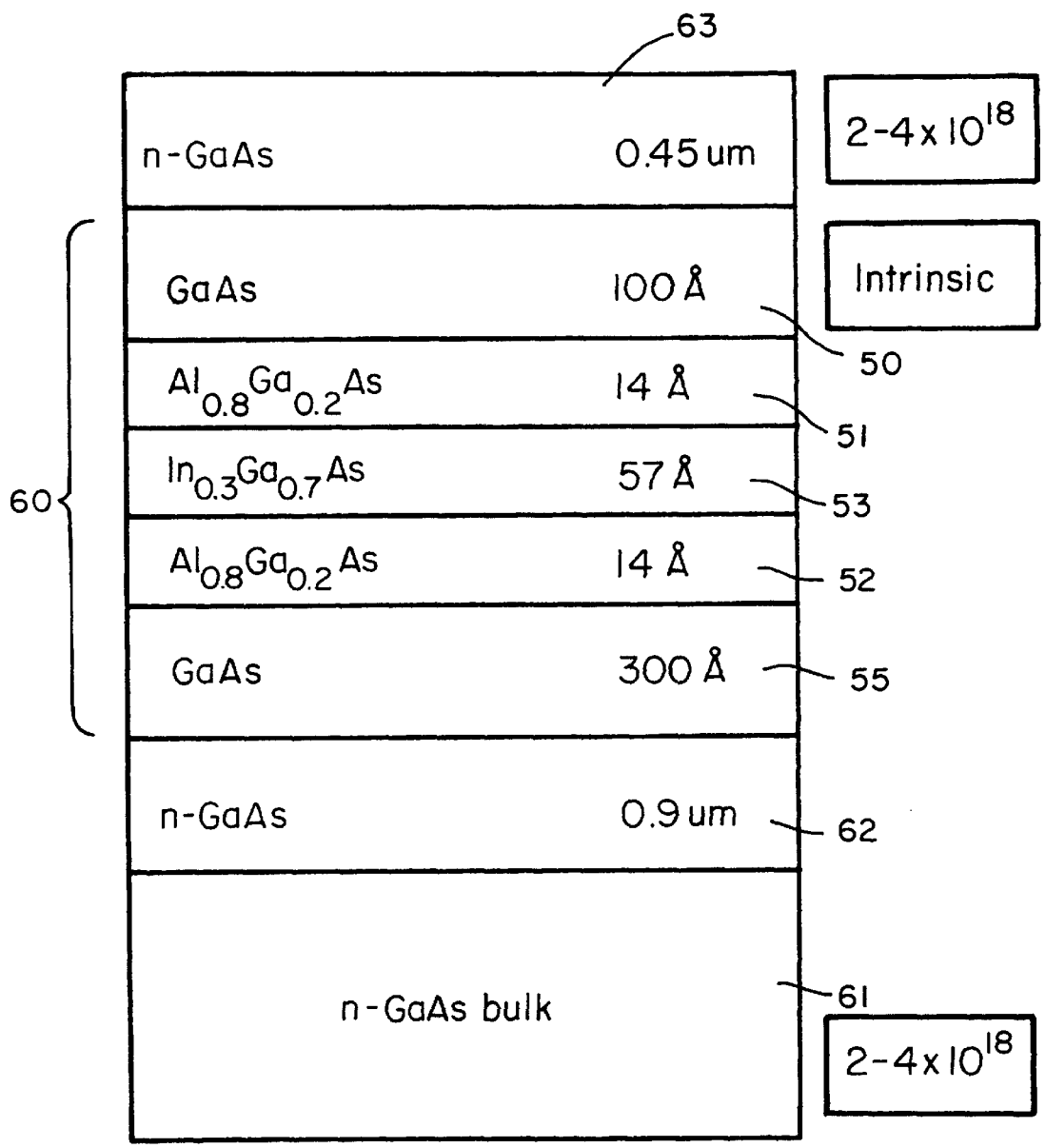
FIG. 6 is a simplified schematic view of the multilayer structure of an embodiment of an RTD in accordance with the present invention.

The present invention achieves all of the desirable characteristics for an RTD in a device structure in the GaAs material system. GaAs is a preferred material because it is less expensive than InP, its technology is the most mature of all III–V material systems, and it provides the possibility of integration with other high-speed devices. A conduction band diagram for an RTD quantum well of a preferred resonant tunneling diode in accordance with the present invention is illustrated in simplified form in FIG. 5, illustrating a GaAs emitter region 50, a first barrier layer 51 and a second barrier layer 52, both formed of AlGaAs, a quantum well layer 53 between the layers 51 and 52, which is formed of InGaAs, and a GaAs collector layer 55 adjacent to the barrier layer 52. In such a multilayer RTD structure the second level band 56 is slightly above the emitter conduction band edge 57. The first level band is illustrated at 58 in FIG. 5. The second level is preferably just at or, as a practical matter, slightly above the conduction band edge because peak voltage for the device increases rapidly as the second level is raised further above the conduction band edge.

Figure 7:
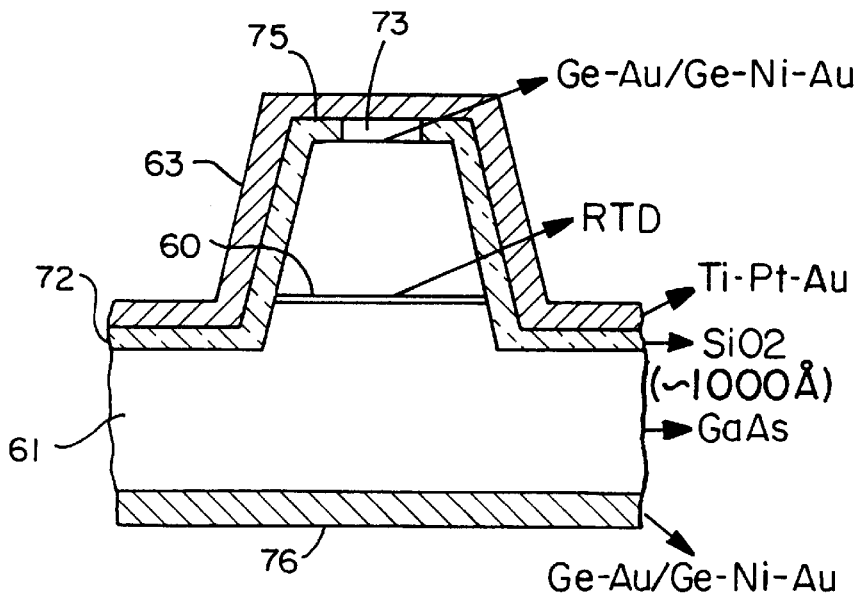
FIG. 7 is a cross-sectional view of an RTD semiconductor device formed in accordance with the present invention.

A schematic view of a practical RTD multilayer structure 60 grown by metal organic chemical vapor deposition (MOCVD) is given in FIG. 6. In this device, n-type gallium arsenide (GaAs) is used as a substrate 61. A suitable dopant is silicon. On this substrate is grown a layer of GaAs 62, followed by the multilayer RTD structure 60 formed of the GaAs spacer layer 55, the barrier layer 52, the quantum well layer 53, the barrier layer 51, and the GaAs intrinsic layer 50, and then followed by a further layer 63 of n-doped GaAs. A cross-sectional view of the physical arrangement of the device is shown in FIG. 7. The RTD structure 60 is preferably grown on the exact-orientation (100) GaAs substrate 61. An insulating layer of silicon dioxide ($SiO_2$) 72 is formed over the substrate 61 and the structure 60 is grown on the substrate, with an opening provided in the insulating layer 72 over an already deposited Ge—Au/Ge—Ni—Au contact 73. A conducting layer 75 of, e.g., Ti—Pt—Au is deposited over the $SiO_2$ insulating layer 72 and forms an electrical connection to a contact 73 to form one externally accessible terminal of the device.

By taking advantage of resonant tunneling through the second energy level of a deep quantum well in a strained-layer structure, this RTD structure provides two times higher peak current densities (PCD's) than conventional GaAs-based resonant tunneling diodes (RTD's) and more than 3 times higher PCD values than those typical of MOCVD-grown RTD's. PCD values higher than 300 kA/cm$^2$, peak voltages as low as 1.2 volts, and peak-to-valley current ratios (PVR's) of 3:1 at 300 K are obtained from the structures of FIG. 7 with, e.g., 14 Å-thick $Al_{0.8}Ga_{0.2}As$ barriers 51 and 52 and a 57 Å-thick $In_{0.3}Ga_{0.7}As$ well 53. The thickness of the various layers can be measured by transmission electron microscopy (TEM).

Figure 8:
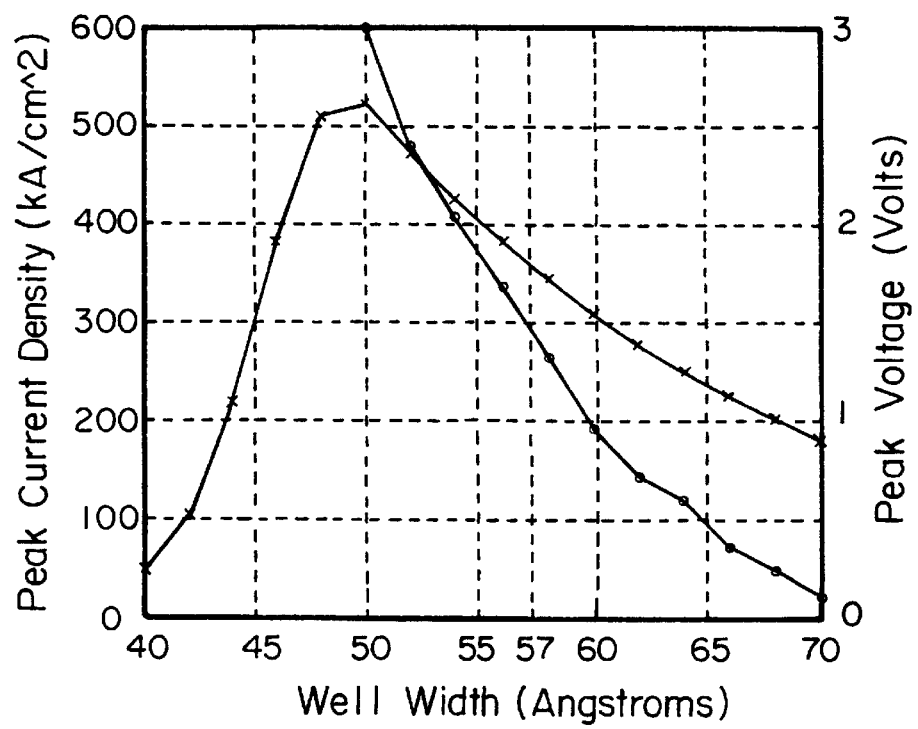
FIG. 8 are calculated peak current density (stars) and peak voltage (blank circles) as a function of well width for the RTD embodiment of FIG. 6.

The GaAs-based RTDs of the present invention have practical advantages over GaSb- and InP-based structures due to the maturity of growth and material processing techniques for GaAs, as well as the possibility of integration of these RTD's with other high-speed devices. The need for relatively high current density, which is basically the crucial figure of merit for high-speed RTD switching applications, has been a major drawback for previous GaAs-based RTD's. As reported in T.P.E. Broekaert, et al., Appl. Phys. Lett., 53 (16), pp. 1545–1547, October 1988, the peak current density associated with the second resonant energy level of an RTD is almost 10 times greater than the one resulting from the first energy level for the same structure, but this level has, however, been attainable only at high peak voltages (≈4 volts). In the present invention, by using a low-bandgap material, $In_{0.3}Ga_{0.7}As$, for the well, the second resonant energy level is well-adjusted to the edge of the conduction band of GaAs, and thus provides a relatively low peak voltage. FIG. 8 shows calculated data demonstrating that, for the structure of FIGS. 6 and 7, (an $In_{0.3}Ga_{0.7}As$ well, 14 Å-thick barriers, and a 300 Å-thick spacer layer), very high PCD values together with a relatively low peak voltage are obtained, while the well thickness stays below the critical value for $In_{0.3}Ga_{0.7}As$ grown on GaAs substrate (≈100 Å).

Figure 9:
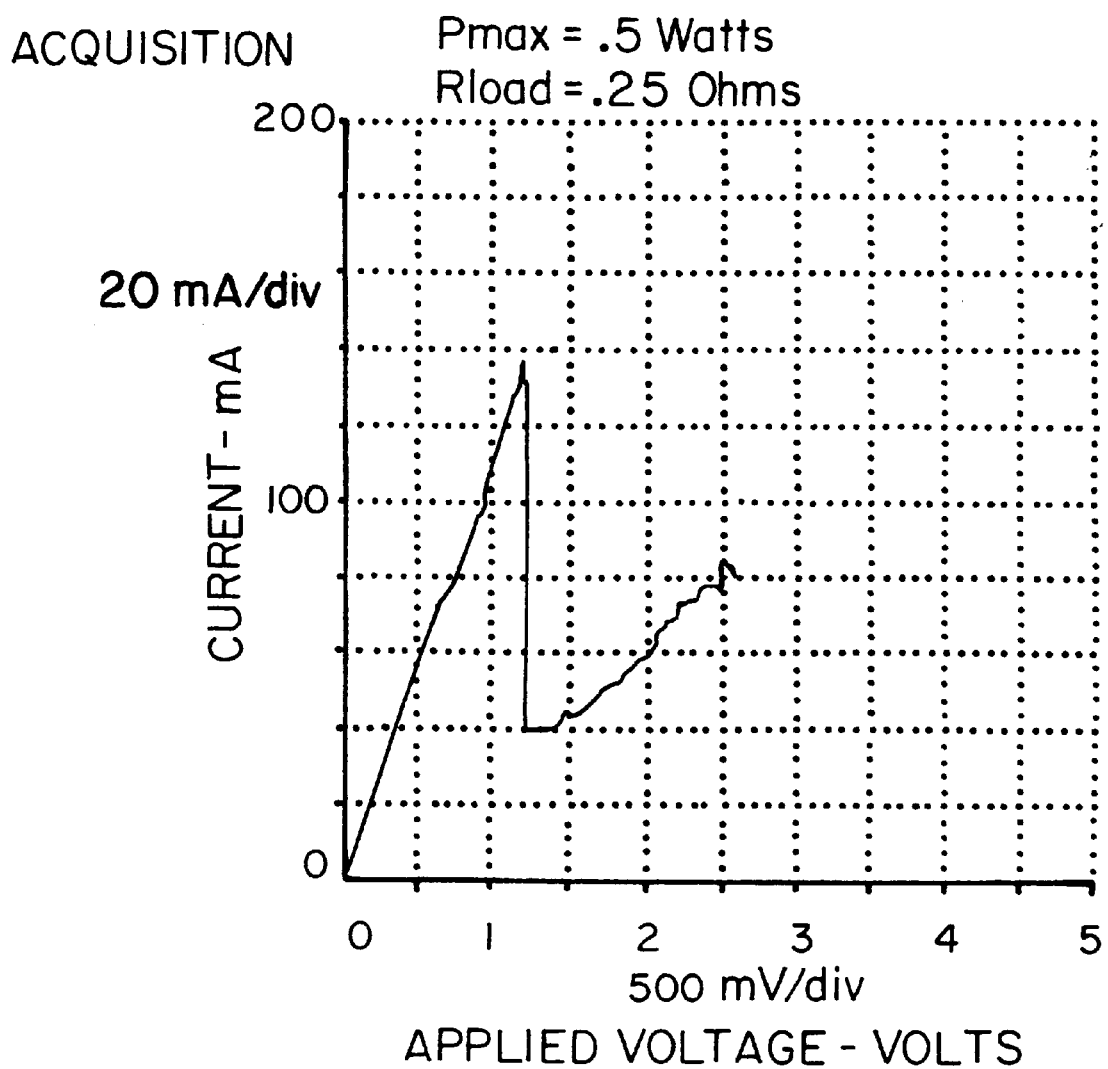
FIG. 9 is a measured current-voltage curve for a 6*6 $\mu$m$^2$ RTD device in accordance with the present invention operating at room temperature.

FIG. 9 shows the measured I–V curve for a 6*6 $\mu m^2$ device as in FIG. 7. Circuit simulations show that this device, if fabricated with minimal parasitic capacitance, can switch 1 volt in less than 3 ps. Optimized spacer layer structures that minimize intrinsic capacitance can be utilized to reduce the switching time by a factor of two or more, resulting in subpicosecond switching speed. The relatively good peak-to-valley current ratio shown in FIG. 9 results from the use of a deep quantum well, good ohmic contacts made by a 2-step process (i.e., as shown in FIG. 7), and the growth on an exact-orientation (100)-GaAs substrate 61, which results in smooth interfaces between the strained-layer quantum well 53 and the barriers 51 and 52.

The following is an illustrative example of a fabrication process in accordance with the invention. The fabrication process consists of two major steps: structure growth and device fabrication.

Material growth is carried out by the Metal Organic Chemical Vapor Deposition (MOCVD) technique, and the quality of the grown structures can be examined by transmission electron microscopy (TEM). By running TEM on several test structures, the growth rates for various layers are very well calibrated (at the level of a few Å). The process is composed of various steps to fabricate proper contacts for emitter and collector sides, and to etch mesas to form isolated devices. Due to the crucial effect of series resistance on the negative differential resistance of RTD's, a two-step process is used to make a low-resistance ohmic contact on top of the mesa (emitter side). Metal contacts are deposited by e-beam metal deposition and patterned by the lift-off technique. The structure may also be grown on a semi-insulating GaAs substrate in accordance with conventional planar processing techniques, in which case all contacts are formed on the same side of the substrate.

A total of three different masks are used throughout the fabrication process; the most precise alignment needed in the process is the alignment of windows in an $SiO_2$ isolation layer with the top metal contacts. The fabrication process is explained in greater detail below.

The RTD structure is grown using low-pressure (50 mbar) metalorganic chemical vapor deposition (LP-MOCVD) in an Aixtron A-200 system, at a growth temperature of 700° C. The metalorganic precursors are trimethylgallium, trimethylaluminum, and trimethylindium. The group V source is arsine with silane used as an n-type dopant. Prior to growth of the RTD structure, the solid composition (x) of $Al_xGa_{1-x}As$ is measured using x-ray diffraction, as a function of the aluminum gas-phase mole-fraction. Growth rates are obtained from film-thickness measurements using scanning electron microscopy. Similarly, the solid composition (y) of $In_yGa_{1-y}As$ is determined from x-ray diffraction rocking curve measurements on thick (relaxed) layers.

To improve the quantum-well interfacial morphology, RTD structures are grown on nominally exact (100), 0° to +/−0.5°, and preferably +/−0.1°, GaAs substrates. Such a substrate orientation is selected because recent studies of strained-layer InGaAs quantum-well structures, via atomic force microscopy (AFM) and low-temperature photoluminescence, indicate that growth using exact on-orientation substrates significantly improves the interfacial structure by eliminating step-bunching. By contrast, the growth of strained-layer InGaAs quantum wells on misoriented substrates will generally result in increased surface roughness and broadening of low-temperature photoluminescence. After growth of the RTD structure, the thicknesses of the layers are confirmed using high-resolution TEM lattice imaging. The TEMs of $In_{0.3}Ga_{0.7}As/Al_{0.8}Ga_{0.2}As/GaAs$ structures show a clear image of distinct layers with relatively abrupt transitions at interfaces. From a high-resolution TEM lattice image, it is possible to estimate the thicknesses of the first barrier 52 (from the bottom), well 53, and second barrier 51 as being 14.5 Å, 57 Å, and 13 Å, respectively, which estimates are in good agreement with the target values. A schematic view of the grown structure 60 in FIG. 6 includes (from bottom to top): a 300 Å spacer layer 55 to reduce the intrinsic capacitance of the device, a 14 Å $Al_{0.8}Ga_{0.2}As$ barrier layer 52, a 57 Å $In_{0.3}Ga_{0.7}As$ well 53, the second barrier layer 51, and a 100 Å layer of intrinsic GaAs to separate the structure from the doped top layer 63.

The device fabrication starts with the deposition of the top metal contact using e-beam metal deposition. In order to make a good ohmic contact, a sequence of various metal layers are used, such as Ge—Au/Ge—Ni—Au. The deposited metal is patterned to 3×3 $\mu m^2$ squares, separated by 1 mm from each other. Then, using chemical etching, mesas of different sizes (from 5×5 $\mu m^2$ to 8×8 $\mu m^2$) are etched around contacts. After covering the whole wafer with a 1000 Å-thick $SiO_2$ film 72 as an isolation layer, 3×3 $\mu m^2$ windows are opened on top of the buried contacts. Then, the second layer of metal, composed of Ti—Pt—Au layers, is deposited on the wafer. In order to facilitate cleaving the wafer into devices, the wafer is thinned to 150 $\mu m$ by mechanical lapping. After depositing the back contact 76 (Ge—Au/Ge—Ni—Au), the contacts are alloyed by rapid thermal annealing in order not to damage the structure (at 400° C. for 30 seconds). The last step is to cleave the wafer into devices.

The major fabrication process steps are summarized below, with further details for steps 4–11:

1. System calibration.
2. Wafer preparation (if necessary).
3. MOCVD device growth.
4. Patterning top contact by lift-off method:
   a) Using mask 2 and negative photoresist to pattern 3 $\mu m$ by 3 $\mu m$ contacts.
   b) Metal evaporation Ge—Au/Ge—Ni—Au.
   c) Removing extra metal.
5. Chemical etching to isolate devices:
   a) Photolithography using mask 1.
   b) Chemical etching for a thickness of greater than 1 $\mu m$.
6. $SiO_2$ deposition by PE-CVD.
7. Patterning SiO2 to open 3 $\mu m$ by 3 $\mu m$ windows, using mask 2.
8. Top contact deposition and patterning by lift-off (mask 3) Ti—Pt—Au.
9. Wafer thinning.
10. Bottom contact deposition Ge—Au/Ge—Ni—Au.
11. Making ohmic contacts by annealing @ 400C for 30 seconds.
12. Cleaving.

Step 4-a:

In order to be able to pattern metal contacts on wafer through the lift-off technique, the thickness of photoresist must be greater than the thickness of deposited metal. Therefore, for this step Shipley AZ 1375 negative photoresist is used.

Spinning: 4500 RPM for 30 seconds

Prebake: 30 min. @ 90° C.

Exposure time: 45 sec. using mask aligner Karl Suss MJB3 (mask 2).

Developing: MF 321 for 1 min.

Postbake: 30 min. @ 120° C.

Step 4-b:

The metal is deposited on top of the patterned photoresist by E-beam metal deposition (CHA Industries) at a pressure below $10^{-6}$ Torr.

Ge: 200 Å

Au/Ge: 800 Å

Ni: 300 Å

Au: 1000 Å

Step 4-c:

By placing the wafer in acetone and using ultrasound agitation, the extra metal from the surface of wafer is lifted (2 min.).

Step 5-a:

Shipley AZ 1805 negative photoresist is used as the mask for mesa definition during the wet etching process. Mask 1 is used to pattern the photoresist.

Spinning: 5000 RPM for 30 seconds

Prebake: 30 min. @ 90° C.

Exposure time: 2.7 sec. (mask 1).

Developing: MF 321 for 45 sec.

Postbake: 30 min. @ 120° C.

Step 5-b:

Isolated mesa structures are formed by the wet etching process using $H_3PO_4/H_2O_2/H_2O$ (5:1:1) solution. The mesas are etched as high as 1 $\mu m$ at a rate of 4000 Å/min at 9° C.

Step 6:

Through Plasma Enhanced Chemical Vapor Deposition (PE-CVD) (Waf'r/Batch Plasma-Therm 70 series system), a 1000 Å-thick layer of $SiO_2$ is deposited on the structures.

Pressure: 900 mTorr.

Temperature: 250° C.

Step 7:

In order to open windows in the $SiO_2$ layer, Shipley AZ 1813 negative photoresist is used which is thick enough to cover the mesas, and forms a planar surface proper for photolithography.

Spinning: 4000 RPM for 30 seconds

Prebake: 30 min. @ 90° C.

Exposure time: 7 sec (mask 2).

Developing: MF 321 for 1 min.

Postbake: 30 min @ 120° C.

Step 8:

The second layer of top metal was deposited by e-beam metal deposition and patterned by lift-off (mask 3).

Ti: 500 Å

Pt: 600 Å

Au: 1000 Å

Step 9:

In order to facilitate cleaving the wafer into devices, it is thinned to 150 $\mu m$ by mechanical lapping (LOGITECH PM2A machine and 3 $\mu m$ Aluminum Oxide powder).

Step 10:

Deposition of bottom contact: The same as step 4-b.

Ge: 200 Å

Au/Ge: 1000 Å

Ni: 300 Å

Au: 3000 Å

Step 11:

By Rapid Thermal Annealing (RTA), the contacts are alloyed at 400° C. for 30 seconds which is short enough not to damage the grown structure.

It is understood that the present invention is not limited to the embodiments disclosed herein, but encompasses all such forms thereof that come within the scope of the following claims.

What is claimed is:

1. A resonant tunneling diode comprising:

(a) a substrate of nominally exact (100) +/−0.5° GaAs;

(b) a multilayer resonant tunneling diode structure grown on the (100) GaAs substrate, the resonant tunneling diode structure comprising a quantum well layer of low band-gap material between barrier layers of AlGaAs, and wherein the material of the quantum well layer is selected such that the second energy level of the quantum well layer is at or slightly above the conduction band edge in GaAs, the quantum well layer grown to be a strained layer with smooth interfaces with the barrier layers.

2. The resonant tunneling diode device of claim 1 wherein the quantum well layer comprises InGaAs.

3. The resonant tunneling diode device of claim 2 wherein the barrier layers are composed of $Al_{0.8}Ga_{0.2}As$, and the quantum well layer is formed of $In_{0.3}Ga_{0.7}As$.

4. The resonant tunneling diode device of claim 3 wherein the barrier layers are about 14 Å thick and the quantum well layer is about 57 Å thick.

5. The resonant tunneling diode device of claim 2 including a spacer layer of intrinsic GaAs adjacent to each barrier layer.

6. The resonant tunneling diode device of claim 5 further including a layer of n-doped GaAs adjacent to each GaAs intrinsic layer.

7. The resonant tunneling diode device of claim 6 wherein the substrate is doped GaAs and the resonant tunneling diode structure is isolated on a mesa with a doped GaAs layer at the top of the mesa and further including an insulating layer over the exposed surfaces of the substrate and the mesa and a contact formed through the insulating layer to the doped GaAs layer, and a contact on the doped GaAs substrate opposite the mesa.

8. The resonant tunneling diode device of claim 1 wherein the substrate is a nominally exact (100) +/−0.1° GaAs substrate.

9. The resonant tunneling diode device of claim 1 wherein the resonant tunneling diode structure is grown on the GaAs substrate by metal organic chemical vapor deposition.

10. A resonant tunneling diode comprising:

(a) a substrate of nominally exact (100) +/−0.5° GaAs;

(b) a multilayer resonant tunneling diode structure grown on the (100) GaAs substrate, the resonant tunneling diode structure comprising a quantum well layer of InGaAs between barrier layers of AlGaAs, a spacer layer of intrinsic GaAs adjacent to each barrier layer, and a layer of n-doped GaAs adjacent to each GaAs intrinsic layer, wherein the second energy level of the quantum well layer is at or slightly above the conduction band edge in GaAs, the quantum well layer grown by metal organic chemical vapor deposition to be a strained layer with smooth interfaces with the barrier layers.

11. The resonant tunneling diode device of claim 10 wherein the barrier layers are composed of $Al_{0.8}Ga_{0.2}As$, and the quantum well layer is formed of $In_{0.3}Ga_{0.7}As$.

12. The resonant tunneling diode device of claim 11 wherein the barrier layers are about 14 Å thick and the quantum well layer is about 57 Å thick.

13. The resonant tunneling diode device of claim 10 wherein the substrate is doped GaAs and the resonant tunneling diode structure is isolated on a mesa with a doped GaAs layer at the top of the mesa and further including an insulating layer over the exposed surfaces of the substrate and the mesa and a contact formed through the insulating layer to the doped GaAs layer and a contact on the doped GaAs substrate opposite the mesa.

14. The resonant tunneling diode device of claim 10 wherein the substrate is a nominally exact (100) +/−0.1° GaAs substrate.

15. A method of making a resonant tunneling diode comprising the steps of:

(a) providing a substrate of nominally exact (100) +/−0.5° GaAs;

(b) growing on the substrate successive layers comprising at least a barrier layer of AlGaAs, a strained quantum well layer of low band-gap material, and a barrier layer of AlGaAs, the quantum well layer grown with smooth interfaces with the barrier layers with the second energy level of the quantum well layer at or slightly above the conduction band edge in GaAs.

16. The method of claim 15 wherein the quantum well layer material is InGaAs.

17. The method of claim 15 wherein the barrier layers are formed to be composed of $Al_{0.8}Ga_{0.2}As$, and the quantum well layer is formed to be composed of $In_{0.3}Ga_{0.7}As$.

18. The method of claim 15 further including growing by metal organic chemical vapor deposition a spacer layer of intrinsic GaAs adjacent to each barrier layer.

19. The method of claim 18 further including growing by metal organic chemical vapor deposition a layer of n-doped GaAs adjacent to each GaAs intrinsic layer.

20. The method of claim 19 wherein the substate is doped GaAs and including isolating the resonant tunneling diode structure on a mesa with a doped GaAs layer at the top of the mesa and further including forming an insulating layer over the exposed surfaces of the substrate and the mesa and forming a contact through the insulating layer to the doped GaAs layer and forming a contact on the doped GaAs substrate opposite the mesa.

21. The method of claim 15 wherein the substrate is nominally exact (100) +/−0.1° GaAs.

22. The method of claim 15 wherein the successive layers are grown on the substrate by metal organic chemical vapor deposition.

* * * * *